United States Patent
Kim et al.

(10) Patent No.: US 11,377,518 B2
(45) Date of Patent: Jul. 5, 2022

(54) ADHESIVE COMPOSITION

(71) Applicant: LG CHEM, LTD., Seoul (KR)

(72) Inventors: So Young Kim, Daejeon (KR); Seung Min Lee, Daejeon (KR); Se Woo Yang, Daejeon (KR)

(73) Assignee: LG Chem, Ltd., Seoul (KR)

( * ) Notice: Subject to any disclaimer, the term of this patent is extended or adjusted under 35 U.S.C. 154(b) by 644 days.

(21) Appl. No.: 16/338,353

(22) PCT Filed: Sep. 29, 2017

(86) PCT No.: PCT/KR2017/010914
§ 371 (c)(1),
(2) Date: Mar. 29, 2019

(87) PCT Pub. No.: WO2018/062930
PCT Pub. Date: Apr. 5, 2018

(65) Prior Publication Data
US 2019/0225740 A1    Jul. 25, 2019

(30) Foreign Application Priority Data

Sep. 30, 2016 (KR) ........................ 10-2016-0126968

(51) Int. Cl.
| | |
|---|---|
| *H01L 51/52* | (2006.01) |
| *C08G 59/24* | (2006.01) |
| *C08G 59/32* | (2006.01) |
| *C08G 59/68* | (2006.01) |
| *C09J 163/00* | (2006.01) |
| *C08G 59/22* | (2006.01) |
| *C09D 163/00* | (2006.01) |
| *H01L 51/56* | (2006.01) |
| *C09J 5/06* | (2006.01) |
| *C08G 59/40* | (2006.01) |
| *C08G 65/18* | (2006.01) |

(52) U.S. Cl.
CPC ......... *C08G 59/226* (2013.01); *C08G 59/223* (2013.01); *C08G 59/40* (2013.01); *C08G 65/18* (2013.01); *C09D 163/00* (2013.01); *C09J 5/06* (2013.01); *C09J 163/00* (2013.01); *H01L 51/5246* (2013.01); *H01L 51/5253* (2013.01); *H01L 51/56* (2013.01); *C09J 2301/416* (2020.08); *C09J 2463/00* (2013.01)

(58) Field of Classification Search
None
See application file for complete search history.

(56) References Cited

U.S. PATENT DOCUMENTS

| | | |
|---|---|---|
| 7,795,744 B2 | 9/2010 | Chen et al. |
| 2007/0208106 A1 | 9/2007 | Chen et al. |
| 2016/0163986 A1 | 6/2016 | Zhou |

FOREIGN PATENT DOCUMENTS

| | | | |
|---|---|---|---|
| CN | 105873974 A | 8/2016 | |
| JP | 2004-231957 A | 8/2004 | |
| JP | 2015-044917 A | 3/2005 | |
| JP | 2006-317520 A | 11/2006 | |
| JP | 2008-063397 A | 3/2008 | |
| JP | 2008291172 A | * 12/2008 | ............. C08G 65/10 |
| JP | 2009098187 A | 5/2009 | |
| JP | 2011-080044 A | 4/2011 | |
| JP | 5044326 B2 | 10/2012 | |
| JP | 5302496 B2 | 10/2013 | |
| JP | 2014-225380 A | 12/2014 | |
| JP | 2015185272 A | 10/2015 | |
| JP | 2016-051602 A | 4/2016 | |
| JP | 2016-102170 A | 6/2016 | |
| KR | 10-2013-0040725 A | 4/2013 | |
| KR | 10-2013-0055552 A | 5/2013 | |
| KR | 10-2013-0058711 A | 6/2013 | |
| KR | 10-1641480 B1 | 7/2016 | |
| KR | 10-2016-0114539 A | 10/2016 | |
| KR | 10-1697892 B1 | 1/2017 | |
| WO | 2008/111640 A1 | 9/2008 | |
| WO | 2015/0198921 A1 | 12/2015 | |

OTHER PUBLICATIONS

Machine translation of JP-2008291172-A (no date).*

* cited by examiner

*Primary Examiner* — Michael J Feely
(74) *Attorney, Agent, or Firm* — Dentons US LLP

(57) ABSTRACT

Disclosed is related to an adhesive composition for encapsulating an organic electronic element and an organic electronic device comprising the same. The adhesive composition includes a curable compound having no carbon-carbon unsaturated group, a thermal initiator, and a photo-initiator. The adhesive composition can form a structure capable of effectively blocking moisture or oxygen introduced from the outside into the organic electronic device, thereby securing the lifetime of the organic electronic device, can realize a top emitting organic electronic device, and can prevent defects such as dark spots which may occur in the organic electronic device.

15 Claims, 1 Drawing Sheet

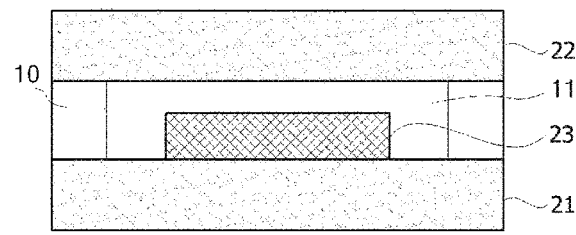

ADHESIVE COMPOSITION

TECHNICAL FIELD

Cross-Reference to Related Applications

This application is a National Stage Entry of International Application No. PCT/KR2017/010914, filed on Sep. 29, 2017, and claims the benefit of and priority to Korean Application No. 10-2016-0126968, filed on Sep. 30, 2016, all of which are hereby incorporated by reference in their entirety for all purposes as if fully set forth herein.

Technical Field

The present application relates to an adhesive composition, an organic electronic device comprising the same, and a method for manufacturing the organic electronic device.

BACKGROUND ART

An organic electronic device (OED) means a device comprising an organic material layer that generates alternate current of charges using holes and electrons, and an example thereof may include a photovoltaic device, a rectifier, a transmitter and an organic light emitting diode (OLED), and the like.

The organic light emitting diode (OLED) among the organic electronic devices has less power consumption and faster response speed, and is more advantageous for thinning display devices or illumination than existing light sources. In addition, the OLED has excellent space utilization, thereby being expected to be applied in various fields covering various portable devices, monitors, notebooks and televisions.

In commercialization and pervasive use of the OLED, the major problem is a durability problem. Organic materials and metal electrodes contained in the OLED are very easily oxidized by external factors such as moisture. Thus, products containing the OLED are highly sensitive to environmental factors. Accordingly, various methods have been proposed to effectively block penetration of oxygen or moisture from the outside into organic electronic devices such as the OLED.

DISCLOSURE

Technical Problem

The present application provides an adhesive composition which can form a structure capable of effectively blocking moisture or oxygen introduced from the outside into the organic electronic device, thereby securing the lifetime of the organic electronic device, can realize a top emitting organic electronic device, and can prevent defects such as dark spots which may occur in the organic electronic device, and an organic electronic device comprising the same.

Technical Solution

The present application relates to an adhesive composition. The adhesive composition may be a seal material applied to sealing or encapsulating organic electronic devices such as, for example, OLEDs. In one example, the adhesive composition of the present application may be applied to sealing or encapsulating the entire surface of an organic electronic element. Thus, after the adhesive composition has been applied to encapsulation, it may be present in the form of encapsulating the entire surface of the organic electronic device.

In this specification, the term "organic electronic device" means an article or apparatus having a structure comprising an organic material layer that generates alternate current of charges using holes and electrons between a pair of electrodes facing each other, and an example thereof may include a photovoltaic device, a rectifier, a transmitter and an organic light emitting diode (OLED), and the like, but is not limited thereto. In one example of the present application, the organic electronic device may be an OLED.

An exemplary adhesive composition may comprise a curable compound, a thermal initiator, and a photo-initiator. The curable compound may have no carbon-carbon unsaturated group. Here, the unsaturated group may include, for example, a carbon-carbon double bond or triple bond, or an unsaturated group present in an aromatic ring. Furthermore, the adhesive composition may have a Shore hardness (Shore A) of 20 to 60, 20 to 58, 35 to 55 or 38 to 54 as measured according to the standard of JIS K 6253 after pre-curing. By dual curing the specific curable compound with light and heat, the present application can improve transparency of the encapsulating layer applied to the entire surface of an element to realize a top emitting organic electronic device, and can prevent chemical damage that may occur in the element, even if the composition is directly applied on the element. Furthermore, by controlling the Shore hardness to the above range after pre-curing, it is to suppress fluidity and permeability of the composition in a liquid form, thereby preventing the composition from penetrating into cracks formed on the element.

Specifically, the adhesive composition of the present application is directly applied to the entire surface of the organic electronic element to form a top encapsulating layer, where in the application process the composition in a liquid form can damage the element. For example, in the organic electronic element, a protective film (passivation film) to be described below may be formed on an electrode, but cracks may occur in the protective film due to foreign substances such as dust. Such a crack may cause a dark spot, and there may be a problem that the composition in the liquid form penetrates between such cracks. However, in the present application, after the adhesive composition is applied to the entire surface of the element to form a top encapsulating layer, the encapsulating layer can be subjected to pre-curing before the above-described penetration, whereby the pre-curing can prevent damage of the element which may be caused by liquid penetration due to the applied composition.

The method of the pre-curing is not particularly limited, which may be performed by photo-curing or thermosetting. In one example, the pre-curing may comprise irradiating the composition with UV of any one light quantity of 0.1 to 10 $J/cm^2$, 0.3 to 8 $J/cm^2$, 0.5 to 5 $J/cm^2$, or 0.8 to 3 $J/cm^2$ at any one wavelength in a range of 300 to 450 nm, 320 to 430 nm, or 340 to 400 nm and any one intensity of 5 to 200 $mW/cm^2$, 10 to 150 $mW/cm^2$, or 30 to 90 $mW/cm^2$.

In an embodiment of the present application, the composition may have any one curing rate after pre-curing, by the pre-curing, of 10 to 90%, 30 to 80%, 40 to 70%, or 45 to 65%. The method of measuring the curing rate is not particularly limited and can be measured by a known method. The measurement of the curing rate can be performed by a method known in the art. For example, the curing rate can be measured using ATR FT-IR. The curing rate measurement using the ATR FT-IR may be measured as a percentage of a change amount (P1−P2) in the curable functional group peak (P2) of the sample to be measured for the curing rate with regard to the curable functional group peak (P1) of the uncured sample. That is, the curing rate can be calculated as (P1−P2)/P1×100. Here, the curable functional group may be, for example, an epoxy group. When the curable functional group is an epoxy group, the curing rate can be derived by analyzing the peak height of the epoxy peak of 908 cm$^{-1}$ with respect to the pre-cured composition using Microscope Raman. That is, in one example, for measuring the curing rate, it can be calculated by measuring the intensity of the peak of the curable functional group or by analyzing the area of the peak.

In one example, the curable compound may comprise at least one or more curable functional groups. The curable functional group may be at least one selected from, for example, a glycidyl group, an isocyanate group, a hydroxy group, a carboxyl group, an amide group, an epoxide group, a cyclic ether group, a sulfide group, an acetal group and a lactone group. The curable compound may be at least bifunctional or more. That is, two or more curable functional groups may be present in the compound. The curable compound realizes excellent heat resistant durability at high temperature and high humidity by realizing an appropriate degree of cross-linking to an adhesive.

In an embodiment of the present application, the curable compound may comprise a compound having a cyclic structure in its molecular structure. In addition, the curable compound may further comprise a linear or branched aliphatic compound or a compound containing at least one oxetane group. By comprising the curable compound, the present application can prevent shrinkage and expansion of a seal material after curing and realize excellent optical characteristics. In this specification, the compound having a cyclic structure in its molecular structure may be referred to as a first curable compound, the linear or branched aliphatic compound may be referred to as a second curable compound, and the compound having at least one or more oxetane groups may be referred to as a third curable compound.

In one example, the compound having a cyclic structure in its molecular structure may be exemplified by 3,4-epoxycyclohexylmethyl 3',4'-epoxycyclohexane carboxylate (EEC) and derivatives, dicyclopentadiene dioxide and derivatives, vinylcyclohexene dioxide and derivatives, and 1,4-cyclohexanedimethanol bis(3,4-epoxycyclohexane carboxylate) and derivatives, but is not limited thereto. As the compound, a commercially available product may be exemplified by Celloxide 2021, Celloxide 2080 or Celloxide 3000 from Daicel. However, in terms of environmental safety, Celloxide 8000 can be excluded.

In one example, the linear or branched aliphatic compound may be included in an amount of 5 to 60 parts by weight, 10 to 55 parts by weight, 15 to 50 parts by weight, 20 to 45 parts by weight, 23 to 43 parts by weight, 28 to 38 parts by weight or 31 to 35 parts by weight relative to 100 parts by weight of the curable compound having a cyclic structure. Also, the compound comprising an oxetane group may be included in an amount of 5 to 60 parts by weight, 10 to 58 parts by weight, 15 to 53 parts by weight, 20 to 48 parts by weight, 23 to 45 parts by weight, 28 to 43 parts by weight or 31 to 43 parts by weight relative to 100 parts by weight of the curable compound having a cyclic structure. By controlling each weight ratio of the curable compounds to the above range, the present application can prevent occurrence of a problem such as clogging of nozzles upon liquid application, thereby improving processability and productivity. In addition, since the desired viscosity or hardness upon pre-curing can be realized in the weight ratio range, it may be effective to prevent the above-described damage of the element.

In this specification, the first curable compound, which is a compound having a cyclic structure, may be an aliphatic compound, and thus can be distinguished from a second curable compound which is a linear or branched aliphatic compound. Also, the third curable compound, which is a compound containing an oxetane group, may be a linear, branched or cyclic aliphatic compound, but it may be distinguished from the two compounds as mentioned above in that it has an oxetane group. Thus, the first and second curable compounds may have no oxetane group.

In one example, the structure of the compound comprising an oxetane group is not limited as long as the compound has the functional group, and for example, OXT-221 from TOAGOSEI or EHO, OXBP, OXTP or OXMA from ETERNACOLL can be exemplified. In addition, the linear or branched aliphatic curable compound may include butyl glycidyl ether, 2-ethylhexyl glycidyl ether, or neopentyl glycol diglycidyl ether, but is not limited thereto.

In an embodiment of the present application, the composition may comprise a thermal initiator and a photo-initiator. The thermal initiator or photo-initiator may be a cationic initiator. As the cationic initiator, a cationic photo-polymerization initiator or a cationic thermal initiator may be used. In an embodiment of the present application, the content ratio of the initiator is not particularly limited, but the content of the photo-initiator may be larger than that of the thermal initiator. By controlling the content ratio of the initiator, the present application can provide an adhesive which satisfies the hardness after pre-curing the adhesive composition in the desired range to prevent damage of the element, and has excellent moisture barrier properties and heat resistant durability in the finally sealed structure upon final curing.

In one example, a material known in the art can be used as the cationic thermal initiator. For example, the cationic thermal initiator may include a compound having a cation moiety centered on an amine group and an $AsF^-$, $SbF_6^-$, $PF_6^-$, or tetrakis(pentafluorophenyl) borate anion moiety.

Also, in the case of the cationic photo-polymerization initiator, a material known in the art may be used, and for example, a compound having a cation moiety comprising an aromatic sulfonium, an aromatic iodonium, an aromatic diazonium or an aromatic ammonium and an anion moiety comprising $AsF_6^-$, $SbF_6^-$, $PF_6^-$, or tetrakis(pentafluorophenyl) borate may be included. In addition, as the cationic photopolymerization initiator, an ionized cationic initiator of onium salt or organometallic salt series or a non-ionized cationic initiator of organosilane or latent sulfonic acid series can be used. The initiator of the onium salt series can be exemplified by diaryliodonium salt, triarylsulfonium salt or aryldiazonium salt, and the like, the initiator of the organometallic salt series can be exemplified by iron arene or the like, the initiator of the organosilane series can be exemplified by o-nitrobenzyl triaryl silyl ether, triaryl silyl peroxide or acyl silane, and the like, and the initiator of the latent sulfuric acid series can be exemplified by α-sulfonyloxy ketone or α-hydroxymethylbenzoin sulfonate, and the like, without being limited thereto.

In an embodiment of the present application, the thermal initiator may be included in an amount of 0.01 to 0.45 parts by weight, 0.01 to 0.4 parts by weight, 0.02 to 0.35 parts by weight, 0.02 to 0.3 parts by weight, 0.03 to 0.25 parts by weight, or 0.03 to 0.25 parts by weight, relative to 100 parts by weight of the curable compound. Also, the photo-initiator may be included in an amount of 0.01 to 0.45 parts by weight, 0.01 to 0.4 parts by weight, 0.02 to 0.35 parts by weight, 0.02 to 0.3 parts by weight, or 0.03 to 0.25 parts by weight relative to 100 parts by weight of the curable compound. The adhesive composition of the present application may contain a small amount of a photo-initiator and a thermal initiator as compared with the prior art, and since the desired viscosity or hardness upon UV pre-curing can be realized in the above weight ratio range, the adhesive composition may be effective to prevent the above-described damage of the element. Furthermore, in encapsulating the entire surface of the element after final curing, a seal material having sufficient moisture barrier properties and endurance reliability may be provided.

In an embodiment of the present application, the adhesive composition may further comprise a cure retardant. The curing retardant may be included in an amount of 0.01 to 10 parts by weight, 0.05 to 5 parts by weight, or 0.05 to 3 parts by weight relative to 100 parts by weight of the curable compound. Within the above content range, the present application can improves storage stability of the adhesive composition, and can more efficiently perform photo-curing and thermal curing. Preferably, the curing retardant is one or more selected from the group consisting of, for example, cyclic polyether, boric acid, phenylboric acid, salicylic acid, hydrochloric acid, sulfuric acid, oxamic acid, tetraphthalic acid, isophthalic acid, phosphoric acid, acetic acid, and lactic acid.

In one example, the adhesive composition may have good light transmittance over the visible light region after curing. In one example, the adhesive composition of the present application can exhibit a light transmittance of 90% or more with respect to the visible light region according to JIS K7105 standard after curing. For example, the adhesive may have a light transmittance of 92% or more or 95% or more with respect to the visible light region, and the upper limit may be 100%. In addition, the adhesive of the present application can exhibit low haze together with excellent light transmittance. In one example, the pressure-sensitive adhesive film may have a haze of 5% or less, 4% or less, 3% or less, or 1% or less, as measured according to the standard of JIS K7105 after curing and the lower limit thereof may be 0% or 0.01%. The optical characteristics may be those measured at 550 nm using a UV-Vis spectrometer.

In addition, the adhesive composition of the present invention may have a YI (yellow index) value in a range of 0 to 2.0, 0 to 1.5, or 0.2 to 1.3 in accordance with ASTM D 1003 standard after curing. By controlling the YI value of the adhesive composition in the above range, the present application can realize excellent optical characteristics of the encapsulating layer, thereby providing a top emitting organic electronic device.

The adhesive composition of the present application may, if necessary, comprise a moisture adsorbent. The term "moisture adsorbent" can be used to collectively mean a component capable of adsorbing or removing moisture or humidity introduced from the outside through physical or chemical reaction or the like. That is, it means a moisture-reactive adsorbent or a physical adsorbent, and a mixture thereof is also usable.

The moisture-reactive adsorbent chemically reacts with humidity, moisture or oxygen, and the like introduced into the adhesive composition or the cured product thereof to adsorb moisture or humidity. The physical adsorbent can increase the movement path of moisture or humidity penetrating the resin composition or the cured product thereof to suppress the penetration and can maximize the barrier characteristics to moisture and humidity through the interaction between the matrix structure of the resin composition or the cured product thereof and the moisture-reactive adsorbent or the like.

The specific kind of the usable moisture adsorbent in the present application is not particularly limited, and for example, in the case of the moisture-reactive adsorbent, it may include one or a mixture of two or more of a metal oxide, a metal salt or phosphorus pentoxide ($P_2O_5$), and the like, and in the case of the physical adsorbent, it may include zeolite, zirconia or montmorillonite, and the like.

Here, a specific example of the metal oxide may include lithium oxide ($Li_2O$), sodium oxide ($Na_2O$), barium oxide (BaO), calcium oxide (CaO) or magnesium oxide (MgO), and the like, an example of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), and the like, but is not limited thereto.

In the present application, the moisture adsorbent such as the metal oxide can be compounded in the composition in a properly processed state. For example, a pulverization process of the moisture adsorbent may be required, and a process such as a three-roll mill, a bead mill or a ball mill may be used for pulverizing the moisture adsorbent.

The adhesive composition of the present application may comprise the moisture adsorbent in an amount of 5 to 100 parts by weight, 5 to 80 parts by weight, 5 to 70 parts by weight or 10 to 30 parts by weight relative to 100 parts by weight of the curable compound. The adhesive composition of the present application can preferably control the content of the moisture adsorbent to 5 parts by weight or more so that the adhesive composition or the cured product thereof exhibits excellent moisture and humidity barrier characteristics. In addition, by controlling the content of the moisture adsorbent to 100 parts by weight or less, when the thin film encapsulating structure is formed, excellent moisture barrier characteristics can be exhibited.

In one example, the adhesive composition may further comprise an inorganic filler, as needed. The specific type of the filler that can be used in the present application is not particularly limited, and for example, one or a mixture of two or more of clay, talc, alumina, calcium carbonate or silica, and the like may be used.

In the present application, in order to improve bonding efficiency between the filler, a product surface-treated with an organic material may also be used as the filler, or an additional coupling agent may be added and used.

The adhesive composition of the present application may comprise 0 to 50 parts by weight, 1 to 40 parts by weight, 1 to 20 parts by weight, or 1 to 10 parts by weight of the inorganic filler relative to 100 parts by weight of the curable compound. The present application can provide an encapsulating structure having excellent moisture or humidity barrier properties and mechanical properties by controlling the inorganic filler to, preferably, 1 part by weight or more. Furthermore, by controlling the content of the inorganic filler to 50 parts by weight or less, the present invention can provide a cured product exhibiting excellent moisture barrier properties even when formed into a thin film.

The adhesive composition according to the present application may comprise various additives, in addition to the above-mentioned configurations, in the range without affecting the above-described effects of invention. For example, the adhesive composition may comprise a defoaming agent, a coupling agent, a tackifier, an ultraviolet stabilizer or an antioxidant, and the like in an appropriate range depending on the desired physical properties. In one example, the adhesive composition may further comprise a defoaming agent. By comprising the defoaming agent, the present application can realize the defoaming property in the above-described process of applying the adhesive composition to provide a reliable encapsulating structure. In addition, as long as the physical properties of the adhesive composition required in the present application are satisfied, the kind of the defoaming agent is not particularly limited.

In one example, the adhesive composition may be in a liquid form at room temperature, for example, about 25° C. In an embodiment of the present application, the adhesive composition may be a solventless type liquid phase. The adhesive composition may be applied to encapsulating an organic electronic element, and specifically, may be applied to encapsulating the entire surface of the organic electronic element. As the adhesive composition has a liquid form at room temperature, the present application can encapsulate the organic electronic element by a method of applying the composition to the side of the element.

An exemplary adhesive composition may have a viscosity of 700 Pa·s to 5,000 Pa·s after light irradiation. Within the viscosity range, the adhesive composition can maintain the desired shape of the encapsulating structure. In one example, the viscosity of the adhesive composition may be measured after irradiating the adhesive composition with light having a wavelength range of a UV-A region band at a light quantity of 3 J/cm$^2$. Also, the viscosity of the adhesive composition may be a viscosity measured depending on a shear stress under conditions of a temperature of 25° C., a 10% strain and a frequency of 1 Hz. In one example, the composition may have a viscosity of 700 Pa·s to 4,000 Pa·s, 800 Pa·s to 3,000 Pa·s, or 900 Pa·s to 2,000 Pa·s.

In this specification, the term "UV-A region" may mean a wavelength range from 315 nm to 400 nm. Specifically, the light having a wavelength range of the UV-A region band herein may mean light comprising any one wavelength in the range of 315 nm to 400 nm, or may mean light having two or more wavelengths in the range of 315 nm to 400 nm.

In an embodiment of the present application, the adhesive composition can form the encapsulating structure of the organic electronic device by conducting the final curing with applying heat after irradiation with light. The thermosetting may proceed to 40° C. to 200° C. In forming the encapsulating structure, despite the high curing temperature, the UV pre-cured adhesive composition is required to have physical properties such that the final curing can be performed without changing the shape. That is, it is necessary to prevent a phenomenon that the adhesive composition spreads at high temperature, or the like. In one example, the adhesive composition may be pre-cured by being irradiated with light having a wavelength range of the UV-A region band at a light quantity of 3 J/cm$^2$, as described above, where the pre-cured resin composition may have a viscosity of 500 Pa·s to 2,000 Pa·s according to a shear stress under conditions of a temperature of 80° C., a 10% strain and a frequency of 1 Hz. The viscosity may be, for example, 500 Pa·s to 1,800 Pa·s, 500 Pa·s to 1,600 Pa·s, or 600 Pa·s to 1,500 Pa·s. By satisfying the viscosity range as above, the adhesive composition of the present application can be effectively applied to the encapsulating of the organic electronic device.

The present application also relates to an organic electronic device. An exemplary organic electronic device may comprise, as shown in the drawing, a substrate (21); an organic electronic element (23) formed on the substrate (21); and a top encapsulating layer (11) encapsulating the entire surface of the organic electronic element (23) and comprising the above-described adhesive composition. In addition, the exemplary organic electronic device may further comprise a side encapsulating layer (10) formed on the substrate (21) so as to surround the side of the organic electronic element (23).

The top encapsulating layer and the side encapsulating layer may be present on the same plane. Here, the "same" may mean substantially the same. For example, the substantially same in the same plane means that there may be an error of ±5 μm or ±1 μm in the thickness direction. The top encapsulating layer can encapsulate the upper surface of the element, and can also encapsulate the side together as well as the upper surface. The side encapsulating layer may be formed on the side of the element but may not directly contact the side of the organic electronic element. For example, the top encapsulating layer can be sealed to be in direct contact with the top and sides of the element. That is, the side encapsulating layer may be located at the outer peripheral portion of the substrate, in a top view of the organic electronic device, without contacting the element.

In this specification, the term "outer peripheral portion" means the edge portion of the perimeter. That is, the outer peripheral portion of the substrate may mean the edge portion of the perimeter in the substrate.

The organic electronic device of the present application may further comprise a cover substrate (22) present on the top encapsulating layer. A material of the substrate or cover substrate is not particularly limited, and the material known in the art can be used. For example, the substrate or cover substrate may be glass or a polymer film. As the polymer film, for example, a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film or a polyimide film, and the like can be used.

The material constituting the side encapsulating layer is not particularly limited, but may comprise the above-described adhesive composition.

On the other hand, the side encapsulating layer may comprise an encapsulating resin, where the encapsulating resin may be exemplified by an acrylic resin, an epoxy resin, a silicone resin, a fluorine resin, a styrene resin, a polyolefin resin, a thermoplastic elastomer, a polyoxyalkylene resin, a polyester resin, a polyvinyl chloride resin, a polycarbonate resin, a polyphenylene sulfide resin, a polyamide resin or a mixture thereof, and the like. The component constituting the side encapsulating layer may be the same as or different from the above-mentioned adhesive composition.

In one example, the organic electronic element may comprise a reflective electrode layer formed on a substrate, an organic layer formed on the reflective electrode layer and comprising at least a light emitting layer, and a transparent electrode layer formed on the organic layer.

In the present application, the organic electronic element (23) may be an organic light emitting diode.

In one example, the organic electronic device according to the present application may be a top emission type, but is not limited thereto, and may be applied to a bottom emission type.

The organic electronic element may further comprise a protective film for protecting the electrode and the light emitting layer of the element. The protective film may be a protective layer by chemical vapor deposition (CVD), whereas the material, a known inorganic material may be used, and for example, silicon nitride (SiNx) may be used. In one example, silicon nitride (SiN x) used as the protective film can be deposited to a thickness of 0.01 μm to 5 μm.

The present application also relates to a method for manufacturing an organic electronic device.

In one example, the manufacturing method may comprise steps of: applying the above-described adhesive composition on a substrate (21), on which an organic electronic element (23) is formed, to encapsulate the entire surface of the organic electronic element (23); irradiating the adhesive composition with light; and applying heat to the adhesive composition. The step of applying the adhesive composition may be a step of forming the top encapsulating layer (11) described above.

Here, the substrate (21) on which the organic electronic element (23) is formed may be manufactured by forming a reflective electrode or a transparent electrode on a substrate (21) such as a glass or a film with a method such as vacuum deposition or sputtering, and forming an organic material layer on the reflective electrode. The organic material layer may comprise a hole injecting layer, a hole transporting layer, a light emitting layer, an electron injecting layer and/or an electron transporting layer. Subsequently, a second electrode is further formed on the organic material layer. The second electrode may be a transparent electrode or a reflective electrode. Then, the above-described top encapsulating layer (11) is applied on the substrate (21) so as to cover the entire surface of the organic electronic element (23). At this time, the method of forming the top encapsulating layer (11) is not particularly limited, and a process such as screen printing or dispenser application of the above-described adhesive composition to the entire surface of the substrate (21) may be used. Also, a side encapsulating layer (10) for encapsulating the side of the organic electronic element (23) can be applied. As the method of forming the top encapsulating layer (11) or the side encapsulating layer (10), a well-known method in the art can be applied, and for example, a liquid drop injection (one drop fill) process can be used.

In addition, in the present invention, a curing process may also be performed on the top or side encapsulating layer that encapsulates the organic electronic device, where such a curing process (final curing) may proceed, for example, in a heating chamber or a UV chamber, preferably, in both. The conditions upon finally curing can be appropriately selected in consideration of stability of the organic electronic device, or the like.

In one example, after applying the above-described adhesive composition to form a top encapsulating layer, the composition may be irradiated with light to induce cross-linking. The light irradiation may comprise irradiating it with light having a wavelength range of the UV-A region band at a light quantity of 0.3 to 6 $J/cm^2$ or a light quantity of 0.5 to 5 $J/cm^2$. As described above, by pre-curing the composition through irradiation with light, it is possible to realize an encapsulating structure shape capable of becoming a basis.

In one example, the manufacturing method may comprise thermally curing the pre-cured adhesive composition at a temperature of 40 to 200° C., 50 to 150° C. or 60 to 130° C. for 15 minutes to 20 hours, 20 minutes to 10 hours, 25 minutes to 5 hours or 27 minutes to 1 hour after light irradiation. Through the step of applying heat, the adhesive composition can perform the final curing.

Advantageous Effects

The present application provides an adhesive composition which can form a structure capable of effectively blocking moisture or oxygen introduced from the outside into the organic electronic device, thereby securing the lifetime of the organic electronic device, can realize a top emitting organic electronic device, and can prevent defects such as dark spots which may occur in the organic electronic device, and an organic electronic device comprising the same.

BRIEF DESCRIPTION OF DRAWINGS

The drawing is a cross-sectional view showing an organic electronic device according to one example of the present invention.

EXPLANATION OF REFERENCE NUMERALS

10: side encapsulating layer
11: top encapsulating layer
21: substrate
22: cover substrate
23: organic electronic element

BEST MODE

Hereinafter, the present invention will be described in more detail with reference to Examples according to the present invention and Comparative Examples not complying with the present invention, but the scope of the present invention is not limited by the following examples.

Example 1

An alicyclic epoxy resin (Celloxide 2021P from Daicel) and an oxetane compound (OXT-221 from TOXOSEI) as curable compounds were introduced into a mixing vessel at a weight ratio of 70:30 (Celloxide2021P: OXT-221) at room temperature. 0.10 parts by weight of a photo-cationic initiator (BASF, Irgacure 290) and 0.03 parts by weight of a thermal cationic initiator (CXC-1612), relative to 100 parts by weight of the curable compounds, were introduced into the vessel.

In the mixing vessel, a uniform composition solution was prepared using a planetary mixer (Kurabo, KK-250s).

Example 2

An alicyclic epoxy resin (Celloxide 2021P from Daicel) and neopentyl glycol diglycidyl ether (TCI, NGDE) as curable compounds were introduced into a mixing vessel at a weight ratio of 75:25 (Celloxide 2021P: NGDE) at room temperature. 0.20 parts by weight of a photo-cationic initiator (BASF, Irgacure 290) and 0.12 parts by weight of a thermal cationic initiator (CXC-1612), relative to 100 parts by weight of the curable compounds, were introduced into the vessel. Furthermore, 0.1 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

Example 3

An adhesive composition was prepared in the same manner as in Example 1, except that an alicyclic epoxy resin (Celloxide 2021P from Daicel) and an oxetane compound (OXT-221 from TOAGOSEI Co., Ltd.) as curing compounds were introduced into a mixing vessel at a weight ratio of 75:25 (Celloxide 2021P: OXT-221) at room temperature and 0.05 parts by weight of a photo-cationic initiator (BASF, Irgacure 290) and 0.10 parts by weight of a thermal cationic initiator (CXC-1612) were introduced into the vessel.

Example 4

An alicyclic epoxy resin (Celloxide 2021P from Daicel) and neopentyl glycol diglycidyl ether (TCI, NGDE) as curable compounds were introduced into a mixing vessel at a weight ratio of 80:20 (Celloxide 2021P: NGDE) at room temperature. 0.10 parts by weight of a photo-cationic initiator (BASF, Irgacure 290) and 0.15 parts by weight of a thermal cationic initiator (CXC-1821), relative to 100 parts by weight of the curable compounds, were introduced into the vessel. Furthermore, 0.1 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

Example 5

Alicyclic epoxy resins Celloxide 2021P (Daicel) and Celloxide 8000 (Daicel) as curable compounds were introduced into a mixing vessel at a weight ratio of 70:30 (Celloxide 2021P: Celloxide 8000) at room temperature. 0.05 parts by weight of a photo-cationic initiator (BASF, Irgacure 290) and 1.0 part by weight of a thermal cationic initiator (CXC-1821), relative to 100 parts by weight of the curable compounds, were introduced into the vessel. Furthermore, 0.12 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

Comparative Example 1

An alicyclic epoxy resin (Celloxide 2021P from Daicel) and an oxetane compound (OXT-221 from TOXOSEI) as curable compounds were introduced into a mixing vessel at a weight ratio of 60:40 (Celloxide2021P: OXT-221) at room temperature. 0.3 parts by weight of a thermal cationic initiator (CXC-1612), relative to 100 parts by weight of the curable compounds, was introduced into the vessel. Furthermore, 0.02 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

Comparative Example 2

An alicyclic epoxy resin (Celloxide 2021P from Daicel) and an oxetane compound (OXT-221 from TOXOSEI) as curable compounds were introduced into a mixing vessel at a weight ratio of 80:20 (Celloxide 2021P: OXT-221) at room temperature. 0.20 parts by weight of a photo-cationic initiator (BASF, Irgacure 290), relative to 100 parts by weight of the curable compounds, was introduced into the vessel.

In the mixing vessel, a uniform composition solution was prepared using a planetary mixer (Kurabo, KK-250s).

Comparative Example 3

An alicyclic epoxy resin (Celloxide 2021P from Daicel) and an oxetane compound (OXT-221 from TOXOSEI) as curable compounds were introduced into a mixing vessel at a weight ratio of 70:30 (Celloxide2021P: OXT-221) at room temperature. 1.0 part by weight of a photo-cationic initiator (BASF, Irgacure 290) and 0.05 parts by weight of a thermal cationic initiator (CXC-1612), relative to 100 parts by weight of the curable compounds, were introduced into the vessel. Furthermore, 0.02 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

Comparative Example 4

At room temperature, alicyclic epoxy resins Celloxide 2021P (Daicel) and Celloxide 8000 (Daicel) as curable compounds were introduced into a mixing vessel at a weight ratio of 80:20 (Celloxide2021P: Celloxide 8000). 0.5 parts by weight of a photo-cationic initiator (MIDORI, DTS-200) and 0.5 parts by weight of a thermal cationic initiator (CXC-1821), relative to 100 parts by weight of the curable compounds, were introduced into the vessel.

In the mixing vessel, a uniform composition solution was prepared using a planetary mixer (Kurabo, KK-250s).

Comparative Example 5

An alicyclic epoxy resin Celloxide 2021P (Daicel) and a bisphenol A epoxy resin (Kukdo Chemical Co., Ltd., YD-128) as curable compounds were introduced into a mixing vessel at a weight ratio of 80:20 (Celloxide2021P: YD-128) at room temperature. 0.1 parts by weight of a photo-cationic initiator (BASF, Irgacure 290) and 0.15 parts by weight of a thermal cationic initiator (CXC-1821), relative to 100 parts by weight of the curable compounds, were introduced into the vessel. Furthermore, 0.10 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

Comparative Example 6

An alicyclic epoxy resin (Celloxide 2021P from Daicel) and neopentyl glycol diglycidyl ether (TCI, NGDE) as curable compounds were introduced into a mixing vessel at a weight ratio of 50:50 (Celloxide 2021P: NGDE) at room temperature. 0.20 parts by weight of a photo-cationic initiator (BASF, Irgacure 290) and 0.12 parts by weight of a thermal cationic initiator (CXC-1612), relative to 100 parts by weight of the curable compounds, were introduced into the vessel. Furthermore, 0.10 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

Comparative Example 7

An alicyclic epoxy resin Celloxide 2021P (Daicel) and an oxetane compound (OXT-221 from TOAGOSEI) as curable compounds were introduced into a mixing vessel at a weight ratio of 55:45 (Celloxide2021P: OXT-221) at room temperature. 0.20 parts by weight of a photo-cationic initiator (BASF, Irgacure 290) and 0.12 parts by weight of a thermal cationic initiator (CXC-1612), relative to 100 parts by weight of the curable compounds, were introduced into the vessel. Furthermore, 0.10 parts by weight of a curing retardant (18-crown-6-ether), relative to 100 parts by weight of the curable compounds, was introduced into the vessel.

In the mixing vessel, a uniform composition solution was prepared using a planetary mixer (Kurabo, KK-250s).

The physical properties in Examples and Comparative Examples were evaluated in the following manner.

1. Viscosity Measurement

Viscosities of the adhesive compositions prepared in Examples and Comparative Examples were measured using RVDV-II+Pro as a Brookfield viscometer (LV type) as follows.

For the prepared adhesive composition, it was measured at a temperature of 25° C. and a rotation speed of 100 rpm. Specifically, the viscosity was measured according to torque at the RV-63 spindle of Brookfield viscometer. In the measurement, when the viscosity was 200 cps or less, the application proceeded easily.

2. Pot Life Measurement 40 g of each adhesive composition prepared in Examples and Comparative Examples was sealed and immersed in a glass vial bottle, and then allowed to stand in an oven at 35° C. to measure the viscosity every 24 hours and the time at which the viscosity became 1.5 times the initial viscosity was recorded. In the measurement, the case where the pot life was at least 90 hours or more was set as the stability passage standard.

3. Shore Hardness Measurement

The adhesive compositions prepared in Examples and Comparative Examples were each applied to a thickness of 0.3 T, then irradiated with UV of 1 J/cm$^2$ at a wavelength of 365 nm and an intensity of 50 mW/cm$^2$, and after one minute, the Shore hardness (Shore A) was measured according to the standard of JIS K 6253.

4. Panel High Temperature and High Humidity Test

The adhesive compositions prepared in Examples and Comparative Examples were each applied to an organic electronic element on which an inorganic vapor-deposited film (chemical vapor deposition film) was formed. Thereafter, the composition was irradiated with UV of 1 J/cm$^2$ at an intensity of 50 mW/cm$^2$, and the curing was carried out by applying heat at 100° C. for 30 minutes. The cured encapsulating layer was allowed to stand in an environment with a temperature of 85° C. and 85% R.H. for 1000 hours, and then the luminescence shape was observed. It was classified as O in the case of no dark spot growth due to foreign substances, Δ in the case where progressive dark spots of foreign substance part were observed and X in the case where progressive dark spots of foreign substance and other dark spots part occurred.

5. Measurement of Yellow Index

The adhesive compositions prepared in Examples and Comparative Examples were each applied between non-alkali glasses (0.7 T), and then irradiated with UV of 1 J/cm$^2$ at an intensity of 50 mW/cm$^2$ and heated at 100° C. for 30 minutes to form an encapsulating layer having a thickness of 100 μm.

The YI (yellow index) value was measured according to ASTM D 1003 standard using a COH 400 transmittance meter from Nippon Denshoku.

5. Out Gas Measurement

The adhesive compositions prepared in Examples and Comparative Examples were each immersed in a head space vial, then irradiated with UV of 1 J/cm$^2$ at an intensity of 50 mW/cm$^2$, and the photo-cured vial was placed in a head space sampler and subjected to GC mass analysis under heat curing conditions (at 100° C. for 30 minutes). The area for each component in the sample was converted to the weight relative to toluene as the reference material, and then divided by the weight of the sample to calculate the out gas content.

TABLE 1

|  |  | Viscosity | Pot life | Hardness | High temperature and high humidity test | YI | Out gas |
|---|---|---|---|---|---|---|---|
| Example | 1 | 87 cps | 149 hours | 43 | O | 0.75 | 50 ppm |
|  | 2 | 105 cps | 99 hours | 53 | O | 0.78 | 32 ppm |
|  | 3 | 101 cps | 118 hours | 41 | O | 0.73 | 81 ppm |
|  | 4 | 164 cps | 102 hours | 39 | O | 0.81 | 43 ppm |
|  | 5 | 156 cps | 34 hours | 47 | O | 4.8 | 40 ppm |
| Comparative Example | 1 | 54 cps | 78 hours | not measurable | X | 0.88 | 251 ppm |
|  | 2 | 92 cps | 490 hours | 58 | Δ | 0.91 | 77 ppm |
|  | 3 | 156 cps | 158 hours | 96 | O | 4.2 | 29 ppm |
|  | 4 | 131 cps | 20 hours | 90 | Δ | 3.5 | 21 ppm |
|  | 5 | 5,200 cps | 151 hours | 45 | Δ | 4.7 | 20 ppm |
|  | 6 | 38 cps | 180 hours | 15 | X | 0.78 | 421 ppm |
|  | 7 | 46 cps | 80 hours | 62 | X | 0.73 | 150 ppm |

The invention claimed is:

1. An adhesive composition for encapsulating an organic electronic element comprising:
   a first curable compound and either a second curable compound or a third curable compound, each curable compound having no carbon-carbon unsaturated group,
   a thermal initiator, and
   a photo-initiator,
   wherein the adhesive composition is in a liquid form at room temperature, wherein the adhesive composition has a Shore hardness (Shore A) of 20 to 60 as measured according to the standard of JIS K 6253 after pre-curing,
wherein the thermal initiator is comprised in an amount of 0.01 to 0.45 parts by weight relative to 100 parts by weight of the curable compounds,
wherein the photo-initiator is comprised in an amount of 0.01 to 0.45 parts by weight relative to 100 parts by weight of the curable compounds,
wherein the first curable compound comprises a compound having a cyclic structure in its molecular structure, and
wherein the second curable compound comprises a linear or branched aliphatic compound, and when present is provided in an amount of 5 to 60 parts by weight relative to 100 parts by weight of the first curable compound; and
wherein the third curable compound comprises a compound containing at least one or more oxetane groups, and when present is provided in an amount of 5 to 60 parts by weight relative to 100 parts by weight of the first curable compound.

2. The adhesive composition for encapsulating an organic electronic element according to claim 1, wherein the pre-curing comprises irradiating the composition with ultraviolet of any one light quantity of 0.1 to 10 $J/cm^2$ at any one wavelength in a range of 300 to 450 nm and any one intensity of 5 to 200 $mW/cm^2$.

3. The adhesive composition for encapsulating an organic electronic element according to claim 1, wherein a curing rate of the composition after pre-curing is any one curing rate in a range of 10 to 90%.

4. The adhesive composition for encapsulating an organic electronic element according to claim 1, wherein the first curable compound and the second curable compound comprise at least one or more curable functional groups.

5. The adhesive composition for encapsulating an organic electronic element according to claim 4, wherein the curable functional group is at least one selected from a glycidyl group, an isocyanate group, a hydroxy group, a carboxyl group, an amide group, an epoxide group, a cyclic ether group, a sulfide group, an acetal group and a lactone group.

6. The adhesive composition for encapsulating an organic electronic element according to claim 4, wherein each curable compound is at least bifunctional or more.

7. The adhesive composition for encapsulating an organic electronic element according to claim 1, wherein the thermal initiator or the photo-initiator is a cationic initiator.

8. The adhesive composition for encapsulating an organic electronic element according to claim 1, further comprising a curing retardant.

9. The adhesive composition for encapsulating an organic electronic element according to claim 8, wherein the curing retardant is comprised in an amount of 0.01 to 10 parts by weight relative to 100 parts by weight of the curable compounds.

10. The adhesive composition for encapsulating an organic electronic element according to claim 1, wherein a light transmittance to visible light according to JIS K7105 standard after curing is 90% or more.

11. The adhesive composition for encapsulating an organic electronic element according to claim 1, wherein a haze measured according to the standard of JIS K7105 after curing is 5% or less.

12. The adhesive composition for encapsulating an organic electronic element according to claim 1, wherein a YI (yellow index) value according to ASTM D 1003 standard after curing is in a range of 0 to 2.0.

13. An organic electronic device comprising a substrate; an organic electronic element formed on the substrate; and a top encapsulating layer encapsulating the entire surface of said organic electronic element and comprising the adhesive composition according to claim 1.

14. The organic electronic device according to claim 13, further comprising a side encapsulating layer formed on the substrate so as to surround the side of the organic electronic element, wherein said side encapsulating layer and said top encapsulating layer are present on the same plane.

15. A method for manufacturing an organic electronic device comprising steps of: applying the adhesive composition of claim 1 on a substrate, on which an organic electronic element is formed, to encapsulate the entire surface of said organic electronic element; irradiating said adhesive composition with light; and applying heat to said adhesive composition.

* * * * *